United States Patent
Han et al.

(10) Patent No.: US 8,338,301 B1
(45) Date of Patent: Dec. 25, 2012

(54) SLURRY-FREE CHEMICAL MECHANICAL PLANARIZATION (CMP) OF ENGINEERED GERMANIUM-ON-SILICON WAFERS

(75) Inventors: Sang M. Han, Albuquerque, NM (US); Darin Leonhardt, Albuquerque, NM (US); Josephine Sheng, Albuquerque, NM (US)

(73) Assignee: STC.UNM, Albuquerque, NM (US)

( * ) Notice: Subject to any disclaimer, the term of this patent is extended or adjusted under 35 U.S.C. 154(b) by 491 days.

(21) Appl. No.: 12/613,161

(22) Filed: Nov. 5, 2009

Related U.S. Application Data

(60) Provisional application No. 61/198,475, filed on Nov. 6, 2008.

(51) Int. Cl.
*H01L 21/302* (2006.01)

(52) U.S. Cl. .......... 438/692; 438/689; 438/691; 216/38; 216/83; 216/88; 216/91; 216/96; 252/79.1

(58) Field of Classification Search .................. None
See application file for complete search history.

(56) References Cited

U.S. PATENT DOCUMENTS

2008/0265375 A1\* 10/2008 Pietsch et al. ................. 257/616
2009/0029552 A1\* 1/2009 Schwandner et al. ........ 438/693

OTHER PUBLICATIONS

Lim et al., Materials Chemistry and Physics, vol. 70, 2001, pp. 129-136.\*

\* cited by examiner

*Primary Examiner* — Lan Vinh
*Assistant Examiner* — Jiong-Ping Lu
(74) *Attorney, Agent, or Firm* — MH2 Technology Law Group, LLP

(57) ABSTRACT

Exemplary embodiments provide methods for planarizing a semiconductor surface. In embodiments, the disclosed planarizing methods can include a chemical mechanical planarization (CMP) process using a slurry-free solution that includes hydrogen peroxide ($H_2O_2$) but is free of particles such as oxide particles. A semiconductor surface (e.g., germanium) can then be planarized to provide a desirable surface roughness. In embodiments, high-quality Group III-V materials can be formed on the planarized semiconductor surface.

8 Claims, 3 Drawing Sheets

100

110
Provide a slurry-free solution containing hydrogen peroxide for a chemical mechanical planarization (CMP)

120
Planarize a semiconductor surface using the slurry-free CMP solution

SLURRY-FREE CHEMICAL MECHANICAL PLANARIZATION (CMP) OF ENGINEERED GERMANIUM-ON-SILICON WAFERS

RELATED APPLICATIONS

This application claims priority from U.S. Provisional Patent Application Ser. No. 61/198,475, filed Nov. 6, 2008, which is hereby incorporated by reference in its entirety.

GOVERNMENT RIGHTS

This invention was made with Government support under Contract Nos. F29601-01-D-0076 and FA9453-06-C-0211 awarded by the Air Force Research Laboratory. The U.S. Government has certain rights in this invention.

FIELD OF THE INVENTION

This invention relates generally to semiconductors and, more particularly, to planarization of semiconductor surfaces.

BACKGROUND OF THE INVENTION

Demand for low-cost, light-weight, mechanically strong, high-efficiency multi-junction solar cells has motivated the development and use of high-quality germanium-on-silicon (GoS) heterostructures to integrate III-V films. However, such integration poses many engineering challenges, ranging from lattice mismatch, to thermal expansion coefficient mismatch, and to non-planar morphological evolution.

The latter challenge, in particular, requires a stringent planarization of the GoS surface to have a low root-mean-square (RMS) roughness. The low surface roughness is desirable for the subsequent growth of Group III-V materials including GaAs in order to maintain, for example, the crystallographic tilt angle of off-cut wafers over the entire surface. The vicinal surface then helps eliminate antiphase domain boundaries in the formed GaAs layer.

Conventional methods to reduce surface roughness of semiconductor materials include a slurry-based chemical mechanical planarization (CMP). Particles (e.g., silica particles) are often used in conventional slurry-based CMP solutions and often leave scratches on Ge-based surfaces after the planarization. In addition, following the slurry-based CMP process, conventional arsine ($AsH_3$) exposure prior to the GaAs growth further roughens the Ge-based surfaces. Consequently, the GaAs growth on the roughened Ge-based surface results in a rough GaAs surface having RMS roughness of greater than 30 nm.

Thus, there is a need to overcome these and other problems of the prior art and to provide methods for planarizing semiconductor surfaces with a low surface roughness.

SUMMARY OF THE INVENTION

According to various embodiments, the present teachings include a method for planarizing a surface. In this method, a slurry-free solution that contains hydrogen peroxide ($H_2O_2$) can be provided for a chemical mechanical planarization (CMP) process of a semiconductor surface. After the CMP process using the slurry-free solution, the semiconductor surface can have a desirable surface roughness. In embodiments, the planarized semiconductor surface can have a low root-mean-square (RMS) roughness of about 10 nm or less, or in embodiments, of about 1 nm or less.

According to various embodiments, the present teachings also include a method for planarizing a surface. Specifically, a slurry-free solution that contains hydrogen peroxide ($H_2O_2$) can be provided to planarize a semiconductor surface using a chemical mechanical planarization (CMP) process. The semiconductor surface can then be exposed to a precursor of one or more of a Group III material and a Group V material using an adjusted exposure. A Group III-V material can further be formed on the exposed semiconductor surface. The formed Group III-V material can have high-quality due to the slurry-free planarization and/or the adjusted exposure of the semiconductor surface.

According to various embodiments, the present teachings further include a method for planarizing a surface. In order to planarize a semiconductor surface, a slurry-free solution that contains hydrogen peroxide ($H_2O_2$) but is free of oxide particles can be provided for a chemical mechanical planarization (CMP) process. The semiconductor surface can include germanium (Ge). Following the CMP process, the semiconductor surface can be further exposed to a gas precursor of one or more of a Group III material and a Group V material using a reduced exposure to reduce a surface roughness thereof. A Group III-V material can then be formed on the planarized and exposed semiconductor surface. The Group III-V material can include, but is not limited to, GaAs, GaAlAs, AlAs, InAs, GaN, AlN, InN, InGaAs, AlGaAs, and AlInGaAs.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention.

DESCRIPTION OF THE EMBODIMENTS

Reference will now be made in detail to exemplary embodiments of the invention, examples of which are illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

Exemplary embodiments provide methods for planarizing an inorganic surface, for example, a semiconductor surface. In embodiments, the disclosed planarizing methods can include a chemical mechanical planarization (CMP) using a slurry-free solution that includes hydrogen peroxide ($H_2O_2$) but is free of particles such as semiconductor oxide or metal oxide particles. A semiconductor surface, for example, a wafer surface of a Group IV material of the periodic table (e.g., germanium) can be planarized with the slurry-free solution to provide a desirable low root-mean-square (RMS) roughness. In embodiments, the planarized semiconductor surface can have a surface RMS roughness of, for example, about 10 nm or less, or in some cases, about 1 nm or less, although other surface roughness can also be included for the planarized semiconductor surface according to various embodiments of the present teachings. In embodiments, the uniformity of this planarized semiconductor surface can maintain the crystallographic tilt angle of off-cut wafers over the entire surface.

Figure 1:
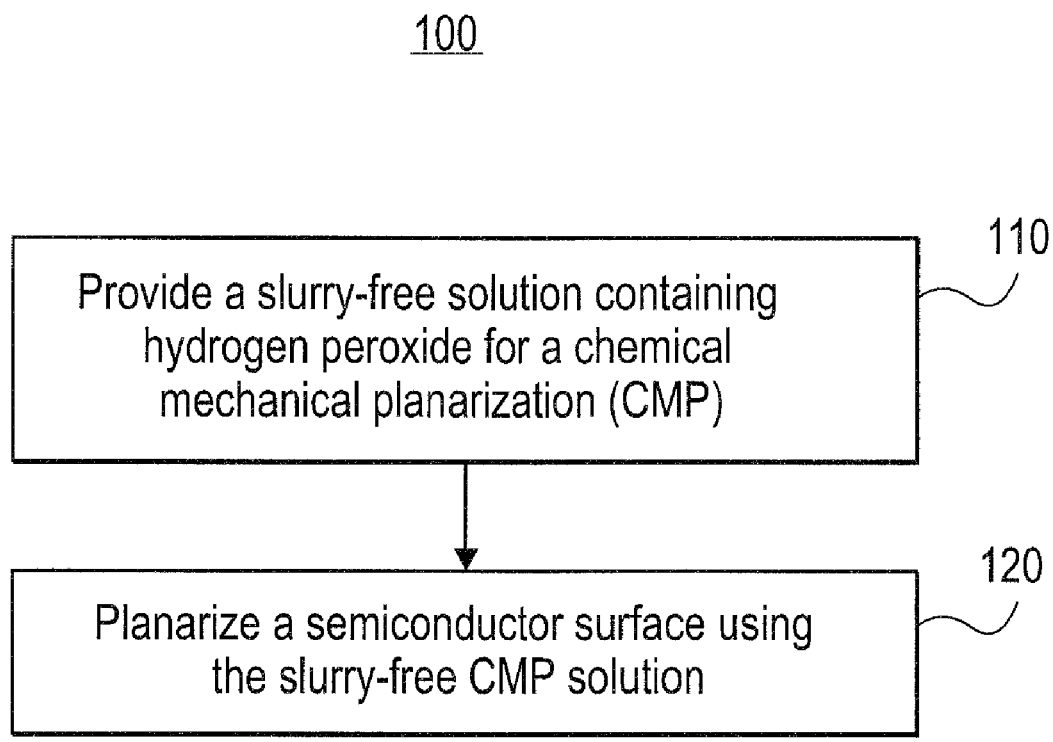
FIG. 1 depicts an exemplary method for planarizing a semiconductor surface in accordance with various embodiments of the present teachings.
Figure 2A:
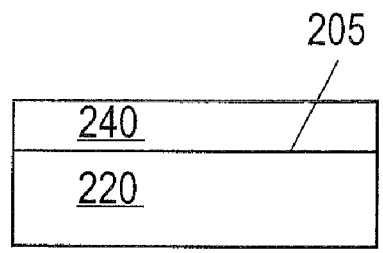
FIGS. 2A-2B depict exemplary semiconductor devices in accordance with various embodiments of the present teachings.
Figure 2B:
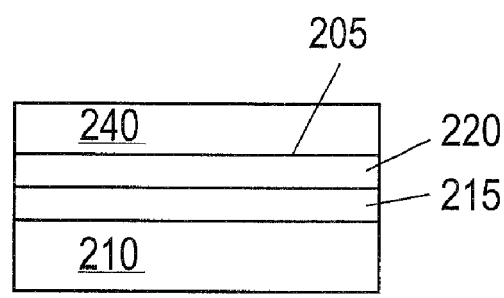

FIG. 1 depicts an exemplary method for planarizing a semiconductor surface and FIGS. 2A-2B depict exemplary semiconductor devices in accordance with various embodiments of the present teachings. Note that although the method 100 will be described in reference to FIGS. 2A-2B for illustrative purposes, the process of method 100 is not limited to the structures shown in FIGS. 2A-2B.

At 110 of FIG. 1, a slurry-free solution can be provided or prepared for a chemical mechanical planarization (CMP) process. In embodiments, the slurry-free solution can include, for example, hydrogen peroxide ($H_2O_2$), but be free of particles, for example, oxide particles, including silica, alumina or any other particles that are used in conventional slurry-based CMP process.

In embodiments, the slurry-free solution can be prepared by mixing deionized water (DI $H_2O$) with hydrogen peroxide ($H_2O_2$). In embodiments, the hydrogen peroxide ($H_2O_2$) can have a concentration ranging from about 0.05% to about 10% by weight of the total slurry-free solution, although other concentrations can be used for the slurry-free CMP solution.

In embodiments, the concentration of hydrogen peroxide ($H_2O_2$) can be adjusted or selected depending on a desired etching rate of the semiconductor surface when planarized using the disclosed CMP process.

In an exemplary embodiment, the deionized water (DI $H_2O$) can be mixed with a diluted hydrogen peroxide ($H_2O_2$) of, for example, about 30% by weight, to form the slurry-free CMP solution. In an exemplary embodiment, 500 parts DI $H_2O$ can be mixed with 10 parts 30 wt. % hydrogen peroxide ($H_2O_2$). In embodiments, a slurry dispenser as known to one of ordinary skill in the art can be used for mixing the DI water with hydrogen peroxide ($H_2O_2$) in order to prepare the slurry-free CMP solution.

At 120 of FIG. 1, a semiconductor surface 205 as exemplarily shown in FIGS. 2A-2B can be planarized with the slurry-free solution to provide a desirable surface RMS roughness. The semiconductor surface 205 can be formed of, for example, a Group IV material 220 of the periodic table.

As shown in FIGS. 2A-2B, exemplary semiconductor device 200A can include a wafer of a Group IV material 220, while exemplary semiconductor device 200B can include, for example, a layer of the Group IV material 220 overlaying a silicon wafer 210. In embodiments, the silicon wafer 210 can be an oxidized silicon wafer having an oxidized layer 215 (e.g., silicon oxide). In exemplary embodiments, the Group IV material 220 can be provided or formed on an offcut 2-inch chemically oxidized Si wafer.

In embodiments, the layer 215 can be a template layer formed of, for example, chemical $SiO_2$, metal oxides such as $Al_2O_3$, and/or metals such as W.

In embodiments, the device 200B can include an exemplary Ge material grown on p-type Si(100) with a 6° offcut towards [110] using molecular beam epitaxy (MBE), as disclosed in U.S. Pat. No. 7,579,263, entitled "Threading-Dislocation-Free Nanoheteroepitaxy of Ge on Si using Self-Directed Touchdown of Ge through a Thin $SiO_2$ Layer," which is hereby incorporated by reference in its entirety.

In embodiments, the semiconductor surface 205 can thus include, for example, Ge, Ge-on-silicon, Ge-on-oxidized silicon, Ge-on-metal oxide and/or Ge-on-metal. The semiconductor surface 205 of the semiconductor devices 200A-B can be planarized with the disclosed slurry-free solution using, for example, a CMP polisher. In embodiments, a soft pad can be used in combination with the slurry-free CMP process to provide a soft abrasion. The soft abrasion on the semiconductor surface 205 can facilitate a local planarization of, for example, elevated surface features to produce a desired surface planarity and surface finish.

In an exemplary embodiment, the semiconductor surface 205 of, for example, a Ge-on-oxidized Si wafer, can be polished using a Logitech PM5 lapping/polishing machine (Fremont, Calif.) on a Logitech Chemcloth polishing pad.

In embodiments, the planarization can provide the semiconductor surface 205 a reduced roughness including, for example, a root-mean-square (RMS) roughness of about 1 nm or less. For example, Ge-on-oxidized Si can have a surface RMS roughness of about 8 to about 10 nm prior to the CMP process and can have a reduced surface RMS roughness of about 0.17 nm after using the slurry-free CMP process. In embodiments, the surface RMS roughness can be measured by atomic force microscopy (AFM).

In embodiments, the planarized semiconductor surface 205 of the devices 200A-B can be further cleaned and/or passivated using various agents and methods including, for example, one or more of HF, HCl, $H_2O_2$, DI water, and plasma. In an exemplary embodiment, the planarized exemplary Ge surface can be rinsed in DI water and cleaned in a capacitively coupled plasma reactor. For example, the exemplary plasma reactor can be an ozone or $O_2$ plasma reactor and operated at about 250 watts and about 1 Torr for about 10 minutes. In embodiments, the plasma operating parameters can vary from plasma system to plasma system.

Figure 3:
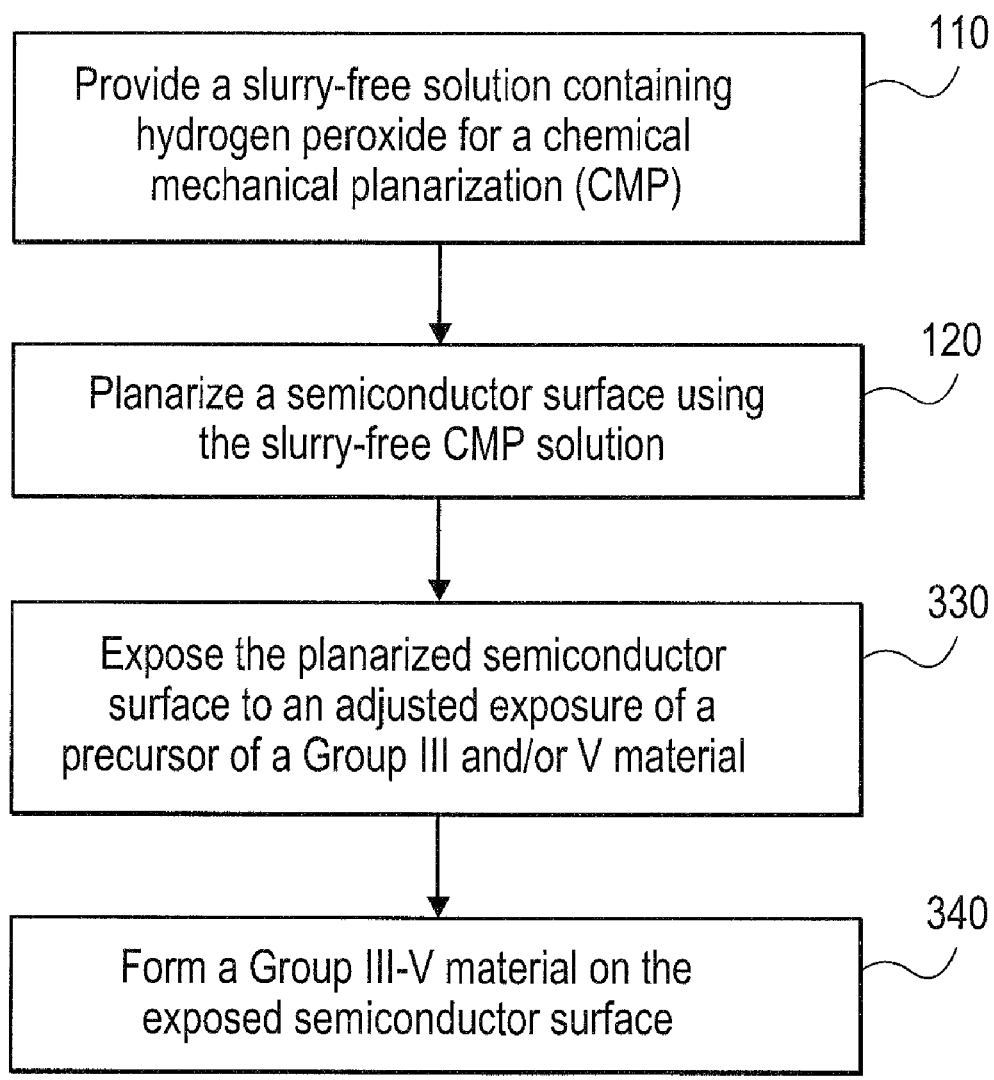
FIG. 3 depicts another exemplary method for planarizing a semiconductor surface in accordance with various embodiments of the present teachings.

Various embodiments can further include forming high-quality Group III-V materials on the planarized semiconductor surface 205 of FIGS. 2A-2B. For example, FIG. 3 depicts another method for planarizing a semiconductor surface and forming a Group III-V material on the planarized semiconductor surface. Note that although the method 300 will also be described in reference to FIGS. 2A-2B for illustrative purposes, the process of method 300 is not limited to the structures shown in FIGS. 2A-2B.

At 110 and 120 of FIG. 3, the semiconductor surface 205 can be planarized as similarly described in FIGS. 1-2 and a Group III-V material 240 can then be formed on the planarized semiconductor surface 205.

In embodiments, the Group III-V material can be a compound including Group III elements and Group V elements of the periodic table. Examples of the Group III elements can include Ga, In, and Al, which can be formed from exemplary Group III precursors, such as trimethylgallium (TMGa) or triethylgallium (TEGa), trimethylindium (TMIn) and trimethylaluminum (TMAl), respectively. Exemplary Group V elements can include As, P and N, which can be formed from exemplary Group V precursors such as arsine ($AsH_3$), tertiarybutylphoshine (TBP), and ammonia ($NH_3$), respectively. Exemplary Group III-V materials can include GaAs, AlGaAs, AlAs, InAs, GaN, AlN, InN, InGaAs, AlGaAs, or AlInGaAs.

In embodiments, the Group III-V material can be formed by various crystal growth techniques including, but not limited to, metal-organic chemical vapor deposition (MOCVD) (also known as organometallic vapor phase epitaxy (OM-VPE)), molecular-beam epitaxy (MBE), gas source MBE (GSMBE), metal-organic MBE (MOMBE), atomic layer epitaxy (ALE), or hydride vapor phase epitaxy (HYPE).

In embodiments, the Group III-V material can be formed by simultaneously or sequentially introducing Group III and/or Group V precursors in a crystal growth reactor as known to one of ordinary skill in the art.

At 330 of FIG. 3, prior to formation of the III-V material (e.g., GaAs), the planarized semiconductor surface 205 (e.g., Ge) can be pretreated by a controlled exposure to a precursor of, for example, a Group III material (e.g., Ga) and/or a Group V material (e.g., As).

In embodiments, prior to the pretreatment at 330 and/or the formation (see 340 of FIG. 3) of the Group III-V material, the planarized, cleaned, and/or passivated semiconductor surface 205 can be further rinsed in DI water and/or in a HF solution. In an exemplary embodiment, the planarized and cleaned surface of Ge-on-oxidized Si (see FIG. 2B) can be rinsed in DI water followed by a 30-second dip in a dilute HF solution immediately before the pretreatment at 330. The dilute HF solution can have a concentration of, for example, about 2% by weight in DI water.

In embodiments, prior to the pre-treatment at 330 and/or the formation (see 340 of FIG. 3) of the Group III-V material, the device 200A-B can be prepared, for example, degassed and/or heated, in order to remove its surface oxide. In an exemplary embodiment, a Ge/Si wafer can be first degassed at about 100° C. for about 30 minutes and then heated to about 700° C. to remove Ge surface oxide.

In embodiments, the pretreatment by the Group III precursor or the Group V precursor at 330 can be controlled such that the subsequently formed Group III-V material can have a desired surface roughness. For example, an adjusted (e.g., reduced or increased) exposure of a selected precursor (e.g., arsine) can result in a desirable surface roughness of the pretreated semiconductor surface (e.g., Ge plus As) and/or of the subsequently formed III-V material (e.g., GaAs).

In embodiments, the term "adjusted exposure" refers to an exposure of one or more of a Group III precursor and a Group V precursor prior to the formation of a III-V material in an adjusted partial pressure, in an adjusted exposure temperature, in an adjusted volume, in an adjusted exposure time, and/or in an adjusted material amount in a crystal growth reactor adjusted from conventional exposure step used prior to the preparation of the Group III-V materials. In certain embodiments, the adjusted exposure can include a reduced exposure including one or more of a reduced partial pressure, a reduced exposure temperature, in a reduced exposure time, and/or a reduced volume or material amount in a crystal growth reactor.

In an exemplary embodiment, a Ge surface (see 205 in FIGS. 2A-2B) can be planarized by the disclosed slurry-free CMP process and can then be pretreated, for example, by a reduced exposure to arsine ($AsH_3$) at a temperature of, for example, about 650° C. prior to the formation of the exemplary GaAs layer (see 240). As a result, when a reduced partial pressure is used for the arsine precursor gas during the pretreatment, a reduced surface roughness can be obtained for the Ge surface and/or the subsequently formed GaAs layer.

In particular examples, a Ge surface treated by a 4.4-Torr-partial-pressure arsine anneal can result in a surface RMS roughness of about 3.1 nm, while a Ge surface treated by a reduced partial pressure of about 0.01 Torr of arsine can result in a surface RMS roughness of about 0.51 nm, less than 1 nm.

At 340 of FIG. 3, a Group III-V material (e.g., GaAs) can then be formed on the planarized and/or pretreated semiconductor surface 205 (e.g., Ge) using various crystal growth techniques.

In embodiments, the disclosed slurry-free CMP process and/or the pretreatment with an adjusted (e.g., reduced) exposure can provide the Group IV semiconductor surface (see 205) with a low roughness for the subsequent formation (see 340 of FIG. 3) of the Group III-V material (see 240 of FIGS. 2A-2B), which may also have a low surface roughness. In a particular example for comparison, if excess arsine is exposed to the Ge surface prior to the GaAs growth, the grown GaAs can be rough, for example, having a RMS roughness of about ~36 nm.

In an exemplary embodiment, MOCVD can be used to grow GaAs and a stack of GaAs/AlGaAs/GaAs on a planarized and pretreated Ge surface in a Veeco D125 system (from Veeco Instruments Inc, Plainview, N.Y.). The growth precursors including, for example, trimethylaluminum (TMAl), trimethylgallium (TMGa), and arsine ($AsH_3$) can be delivered into a hydrogen ambient of the MOCVD growth reactor. Deposition of GaAs/AlGaAs/GaAs can occur at 650° C. with partial pressures of about 0.9 mTorr for TMAl, about 2.1 mTorr for TMGa, and about 0.4 Torr for $AsH_3$.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." As used herein, the term "one or more of" with respect to a listing of items such as, for example, A and B, means A alone, B alone, or A and B. The term "at least one of" is used to mean one or more of the listed items can be selected.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume values as defined earlier plus negative values, e.g. −1, −1.2, −1.89, −2, −2.5, −3, −10, −20, −30, etc.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for planarizing a surface comprising:
providing a polishing solution that is essentially free of oxide particles for a chemical mechanical planarization (CMP), wherein the polishing solution comprises hydrogen peroxide ($H_2O_2$); and
planarizing a surface comprising a semiconductor material using the polishing solution and a soft pad in contact with the semiconductor surface in the CMP process to provide a surface root-mean-square (RMS) roughness of about 1 nm or less.

2. The method of claim 1, wherein the polishing solution is essentially free of particles.

3. The method of claim 1, wherein the hydrogen peroxide ($H_2O_2$) has a concentration ranging from about 0.05% to about 10% by weight of the total polishing solution.

4. The method of claim 1 further comprising mixing deionized water with a diluted hydrogen peroxide ($H_2O_2$) solution to provide the polishing solution.

5. The method of claim 1 further comprising adjusting a concentration of the hydrogen peroxide in the polishing solution according to a desirable etch rate of the hydrogen peroxide to the semiconductor surface.

6. The method of claim 1, wherein the semiconductor surface is made of a Group IV material comprising germanium, germanium-on-silicon or germanium-on-oxidized silicon.

7. The method of claim 1 further comprising cleaning the planarized surface using deionized water and plasma.

8. The method of claim 1, wherein the solution is free of oxide particles.

* * * * *